(12) United States Patent
Mune et al.

(10) Patent No.: US 6,904,674 B2
(45) Date of Patent: *Jun. 14, 2005

(54) PROCESS FOR MANUFACTURING A PRINTED WIRING BOARD

(75) Inventors: Kazunori Mune, Osaka (JP); Hirofumi Fujii, Osaka (JP); Satoshi Tanigawa, Osaka (JP)

(73) Assignee: Nitto Denko Corporation, Osaka (JP)

( * ) Notice: Subject to any disclaimer, the term of this patent is extended or adjusted under 35 U.S.C. 154(b) by 183 days.

This patent is subject to a terminal disclaimer.

(21) Appl. No.: 10/119,695

(22) Filed: Apr. 11, 2002

(65) Prior Publication Data

US 2002/0108781 A1 Aug. 15, 2002

Related U.S. Application Data

(62) Division of application No. 09/626,891, filed on Jul. 27, 2000, now abandoned.

(30) Foreign Application Priority Data

Jul. 30, 1999 (JP) ........................................ P. 11-216211

(51) Int. Cl.[7] ................................................. H01K 3/10
(52) U.S. Cl. ............................. 29/852; 29/825; 29/830; 29/832; 29/841; 29/846; 29/847; 174/261; 174/264; 216/17; 216/18; 216/20
(58) Field of Search ........................ 29/852, 832, 841, 29/846, 825, 830, 847; 174/261, 264; 216/17, 18, 20

(56) References Cited

U.S. PATENT DOCUMENTS

| | | | | |
|---|---|---|---|---|
| 5,231,751 A | * | 8/1993 | Sachdev et al. | 29/852 |
| 5,373,627 A | * | 12/1994 | Grebe | 29/841 |
| 5,388,328 A | * | 2/1995 | Yokono et al. | 29/852 |
| 5,821,626 A | | 10/1998 | Ouchi et al. | |
| 6,159,853 A | * | 12/2000 | Lai | 438/676 |
| 6,617,681 B1 | * | 9/2003 | Bohr | 257/700 |
| 6,662,442 B1 | * | 12/2003 | Matsui et al. | 29/852 |

FOREIGN PATENT DOCUMENTS

| | | |
|---|---|---|
| JP | 7-186323 | 7/1995 |
| JP | 10-135598 | 5/1998 |

* cited by examiner

*Primary Examiner*—Carl J. Arbes
*Assistant Examiner*—Tim Phan
(74) *Attorney, Agent, or Firm*—Sughrue Mion, PLLC

(57) ABSTRACT

A printed wiring board, particularly, an interposer 20 for a chip scale package, comprising an outer insulator layer 22 having outer electrodes 31, a conductor layer 21, and an inner insulator layer 23 having inner electrodes 27, the electrodes 31 and/or 27 having been formed by electroplating using, as a negative electrode, a metal plate 32 that has been provided on the outer insulator layer 22 and removed after the electroplating. Having no plating leads, the printed wiring board has the electrodes in an orderly array at a fine pitch and a high density.

4 Claims, 11 Drawing Sheets

PROCESS FOR MANUFACTURING A PRINTED WIRING BOARD

This is a divisional of application Ser. No. 09/626,891 filed Jul. 27, 2000 now abandoned, the disclosure of which is incorporated herein by reference.

FIELD OF THE INVENTION

This invention relates to a process for producing a printed wiring board and, more particularly, a printed wiring board suitable as an interposer of chip size packages for electrically connecting a semiconductor chip to an external printed wiring board.

BACKGROUND OF THE INVENTION

With the recent tendencies for electronic equipment to have smaller size and weight, semiconductor chip packages for mounting have been reduced in dimensions. In this line, so-called chip size packages (also called chip scale packages) have been developed as means for providing minimally packaged chips which are about the size of bare chips.

As shown in FIG. 14, a chip size package is mounted on an external wiring board 2 with an interposer 3 interposed therebetween to establish electrical connections between the electrodes (not shown) of the chip 1 and the electrodes 12 of the external printed wiring board 2.

The interposer 3 has an outer insulator layer 6, a conductor layer 4 formed on the outer insulator layer 6 in a prescribed circuit pattern, and an inner insulator layer 5 formed thereon. The inner insulator layer 5 have inner via-holes 7 mated with the electrodes of the chip 1, and inner electrodes 8 are formed in the inner via-holes 7. The outer insulator layer 6 has outer via-holes 9 mated with the electrodes 12 of the external circuit board 2, in which outer electrodes 10 are formed. Solder balls 13 are connected to the outer electrodes 10.

The inner insulator layer 5 of the interposer 3 is joined to the back face of the semiconductor chip 1 to connect the inner electrodes 8 and the electrodes of the chip 1. In surface mounting, the outer electrodes 10 of the package are connected to the electrodes 12 of the external circuit board 2 via the solder balls 13, whereby electric connections between the electrodes of the chip 1 and those of the external printed wiring board 2 are established through the inner electrodes 8, the conductor layer 4, the outer electrodes 10, and the solder balls 13 of the interposer 3. The semiconductor chip 1 has been sealed with a sealant 11.

In producing the interposer 3, where the inner electrodes 8 and the outer electrodes 10 are formed by electroplating, it is necessary to form plating leads in the conductor layer 4. However, lead formation often restricts the arrangement or the interval of the electrodes, failing to form electrodes at a fine pitch and a high density. As a result, difficulties are often met with in efficiently reducing the interposer 3 in size. Further, if the plating lead remains in the resulting interposer 3, it tends to induce a crosstalk which causes a noise.

SUMMARY OF THE INVENTION

An object of the present invention is to provide a printed wiring board in which electrodes are arrayed at a fine pitch and a high density and therefore has possibility of having its size reduced efficiently and which hardly causes a crosstalk.

The above object is accomplished by a printed wiring board comprising a conductor layer and at least one insulator layer having through-holes connecting with the conductor layer, the through-holes each having an electrode formed by electroplating to electrically connect the conductor layer and external electrodes, wherein the conductor layer has no plating lead for forming the electrodes.

It is preferred that the printed wiring board has two insulator layers with the conductor layer provided therebetween.

The printed wiring board of the invention is preferably produced by a process comprising at least the steps of (1) forming an insulator layer having through-holes at predetermined positions on a metal plate which can serve as a negative electrode of electroplating, (2) forming electrodes in the through-holes by electroplating using the metal plate as a negative electrode, (3) forming a conductor layer on the insulator layer, the conductor layer being connected to the electrodes, and (4) removing the metal plate. In a highly preferred embodiment of the process, the step of forming a conductor layer is carried out by continued electroplating subsequent to the step of forming electrodes.

The process can further comprise the step of forming an insulator layer having through-holes at predetermined positions on the conductor layer and the step of forming electrodes in the through-holes of the thus formed insulator layer by electroplating using the metal plate as a negative electrode.

The printed wiring board of the invention is suitable as an interposer for chip size packages.

Having no leads, the printed wiring board of the invention is allowed to have the electrodes arrayed at a fine pitch and a high density with no restrictions that might have been placed where plating leads are provided for forming the electrodes. This enables efficient size reduction of a wiring board and eliminates crosstalks attributable to plating leads thereby to provide a printed wiring board having improved reliability. Where all the electrodes of the wiring board are formed by electroplating using, as a negative electrode, a metal plate that is provided on an insulator layer and removed therefrom after all the electroplating operations complete, the electrodes can be formed with ease and reliability.

DETAILED DESCRIPTION OF THE INVENTION

Figure 1:
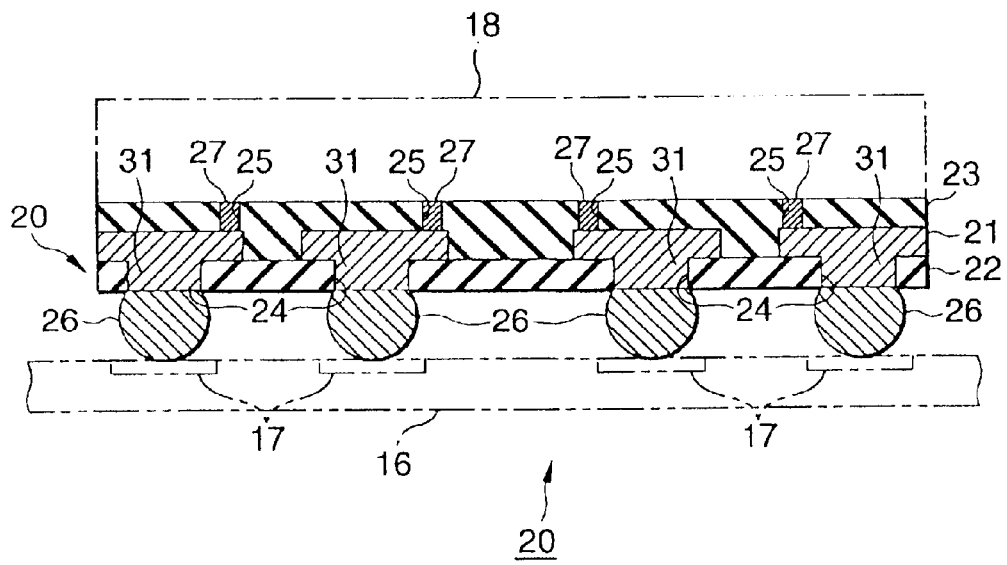
FIG. 1 is a cross-sectional view of an interposer for a chip size package, which is one embodiment of the printed wiring board of the present invention.

FIG. 1 is a cross-sectional view of an interposer 20 for chip size packages as an embodiment of the printed wiring board according to the invention. The printed wiring board of the invention will be described in detail with particular reference to this interposer for chip size packages.

The interposer 20 has a three-layered structure composed of an outer insulator layer 22, a conductor layer 21 formed on the outer insulator layer 22 in a prescribed circuit pattern, and an inner insulator layer 23 formed on the conductor layer 21.

The outer insulator layer 22 and the inner insulator layer 23 have outer via-holes 24 and inner via-holes 25, respectively, which are open to the conductor layer 21. In the outer via-holes 24 and the inner via-holes 25 are formed outer electrodes 31 and inner electrodes 27, respectively, which connect with the conductor layer 21. Solder balls 26 are affixed to the outer electrodes.

The interposer 20 is interposed between a semiconductor chip 18 and an external wiring board 16 to establish electrical connections between the electrodes (not shown) of the chip 18 and inner electrodes 27 and between the solder balls 26 and the electrodes 17 of the external wiring board 16, whereby the semiconductor chip 18 can be surface mounted as a chip size package.

Figure 2:
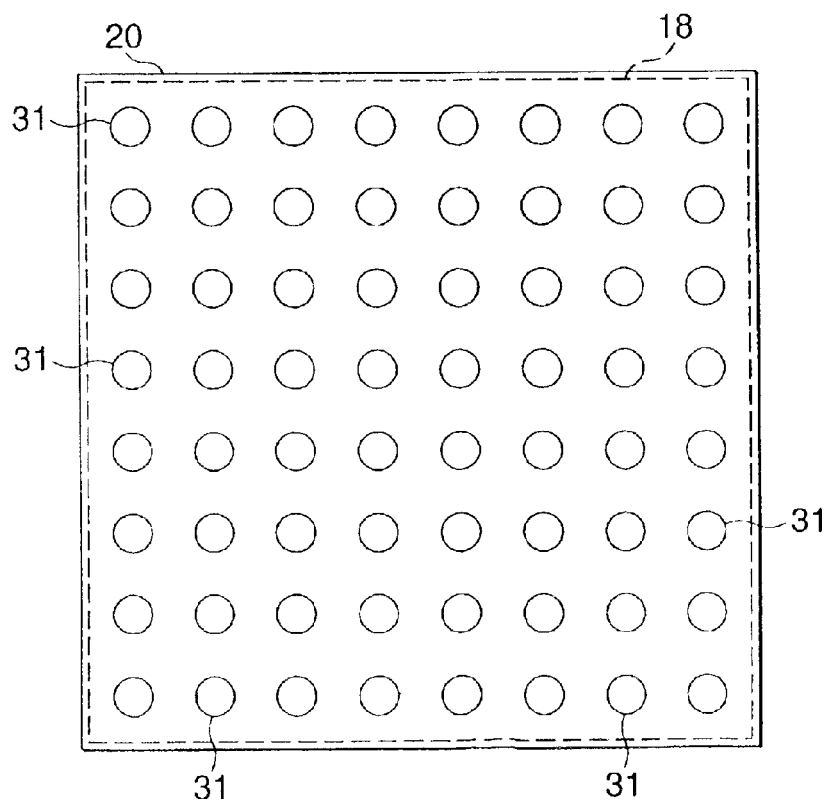
FIG. 2 is a schematic plan view of the outer side of the interposer shown in FIG. 1.

Since the outer electrodes 31 and the inner electrodes 27 are formed by electroplating as hereinafter described without forming plating leads on the conductor layer 21, the arrangement and interval of these electrodes are not restricted by the arrangement and interval of plating leads. For example, as shown in FIG. 2, the outer electrodes 31 can be arrayed regularly at a fine pitch and a high density.

Figure 3A:
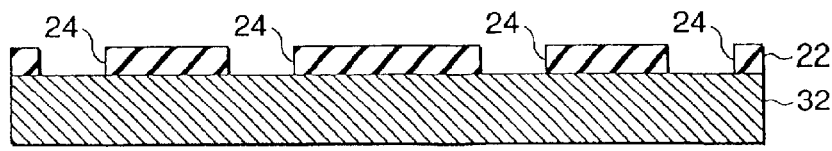
FIGS. 3A to 3F show the steps involved in the process of producing the interposer shown in FIG. 1.

The interposer 20 for chip size packages can be produced as follows. In step (1) shown in FIG. 3A, an outer insulator layer 22 having via-holes 24 is formed on a metal plate 32. The metal plate 32 acts as a negative electrode in electroplating hereinafter described. It is also to support the outer insulator layer 22 and to secure rigidity of the conductor layer 21 and the inner insulator layer 23 provided thereon thereby to improve the workability in forming these layers. Where the outer insulator layer 22 and the inner insulator layer 23 are formed by applying a resin followed by curing, the metal plate 32 also serves to prevent thermal shrinkage on curing.

Any metal that can serve as a negative electrode in electroplating can be used as the metal plate 32. Taking into consideration stiffness (nerve), low linear expansion coefficient, and ease of removal, 42 alloy or stainless steel is particularly preferred. While not limiting, the thickness of the metal plate 32 is suitably about 10 to 100 µm.

The material of the outer insulator layer 22 is not particularly limited as far as it is electrically insulating. For example, it is formed of resins well-known in the art as an insulator of printed wiring boards, such as polyimide, polyether sulfone, polyether nitrile, polyethylene terephthalate, polyethylene naphthalate, and polyvinyl chloride. The thickness of the outer insulator layer 22, while not limited, suitably ranges from 5 to 50 µm.

Figure 4A:
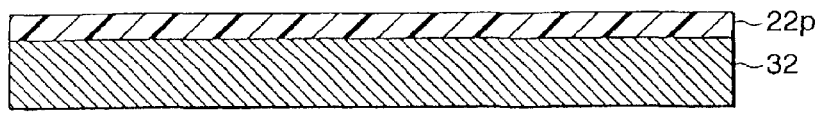
FIGS. 4A to 4D show an embodiment for carrying out the step shown in FIG. 3A (formation of an outer insulator layer having outer via-holes on a metal plate).

Of the useful resins, photosensitive resins, such as photosensitive polyimide and photosensitive polyether sulfone, are preferably used so that forming the outer insulator layer 22 and making the outer via-holes 24 can be achieved simultaneously. The manner of forming the outer insulator layer 22 having through-holes 24 by use of a photosensitive polyimide is shown in FIG. 4. As shown in FIG. 4A, a resin layer 22p of photosensitive polyamic acid, a precursor of photosensitive polyamide, is formed on the metal plate 32. The photosensitive polyamic acid resin comprises a polyamic acid resin, which is obtained by the reaction between an acid dianhydride and a diamine, and a photosensitizer.

Preferred examples of the acid dianhydride are 3,3'4,4'-biphenyltetracarboxylic acid dianhydride, pyromellitic dianhydride, 3,3',4,4'-oxydiphthalic acid dianhydride (ODPA), 2,2-bis(3,4-dicarboxyphenyl)hexafluoropropane dianhydride (6FDA), and 3,3',4,4'-benzophenonetetracarboxylic acid dianhydride (BTDA). Preferred examples of the diamine are p-phenylenediamine (PPD), bisaminopropyltetramethyldisiloxane (APDS), and 4,4'-diaminodiphenyl ether (DDE).

The polyamic acid resin is prepared by allowing the acid dianhydride and the diamine at practically an equimolar ratio in an appropriate organic solvent (e.g., N-methyl-2-pyrrolidone, N,N-dimethylacetamide or N,N-dimethylformamide) at room temperature under atmospheric pressure for a predetermined period of time. The polyamic acid resin is obtained in the form of a solution.

The photosensitizer added to the polyamic acid resin preferably includes 1,4-dihydropyridine derivatives, especially 1-ethyl-3,5-dimethoxycarbonyl-4-(2-nitrophenyl)-1,4-dihydropyridine. The photosensitizer is usually added in an amount of 0.1 to 1.0 mol per mole of the total amount of the acid dianhydride and the diamine, i.e., the polyamic acid. If it is added in amounts exceeding 1.0 mol, the cured outer insulator layer 22 may have reduced physical properties. If the amount of the photosensitizer is less than 0.1 mol, sensitivity for forming the outer via-holes 24 tends to be insufficient. If desired, the photosensitive polyamic acid resin can contain bisallylnudic imide, maleimide, etc. It is preferred for the photosensitive polyamic acid resin for the outer insulator layer 22 to have a glass transition temperature (Tg) of 250° C. or higher, particularly 300° C. or higher, after curing.

The photosensitive polyamic acid resin is applied onto the metal plate 32 to a given thickness by, for example, coating in a usual manner and dried, or transferring a previously prepared dry film of the resin having a given thickness to the metal plate 32.

The outer polyamic acid resin layer 22p thus formed is exposed to light through a photomask and developed to form the outer insulator layer 22 having the outer via-holes 24. If necessary, the exposed area may be heat treated at a prescribed temperature before development. For exposure, any radiation to which the photosensitive polyamic acid resin is sensitive, such as ultraviolet rays, electron beams or microwaves, can be used. The exposed area of the polyamic acid resin layer 22p is rendered soluble in the subsequent development (positive) by heating, for example, at 130° C. or higher and below 150° C., or insoluble in the subsequent development (negative) by heating, for example, 150 to 180° C. Development can be carried out in a conventional manner, for example, by soaking in or spraying with a known developer, such as an alkaline solution.

Figure 4B:
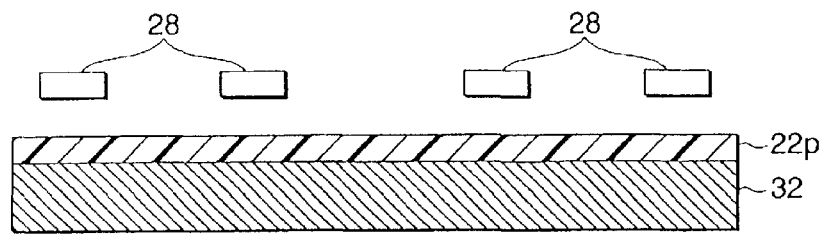
Figure 4C:
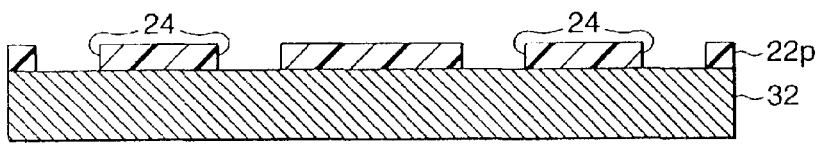

While the outer via-holes 24 can be made by either positive or negative patterning as described above, a negative patterning mode, which is shown in FIGS. 4B and 4C, is preferred. In this case, a photomask 28 is properly positioned on the photosensitive polyamic acid resin layer 22p to be mated with the electrodes 17 of an external circuit board 16 (see FIG. 1). After the exposure, the polyamic acid resin layer 22p is heated at a prescribed temperature (e.g., 150 to 180° C.) to make the exposed area insoluble in development and then developed with an appropriate developer to dissolve and remove the unexposed area (the area masked under the photomask 28) thereby to form outer via-holes 24.

Figure 4D:
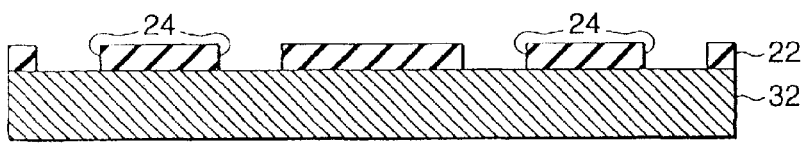

The polyamic acid resin layer 22p having the outer via-holes 24 is cured by, for example, heating to a final temperature of 250° C. or higher to form an outer insulator layer 22 of polyimide shown in FIG. 4D.

Figure 5A:
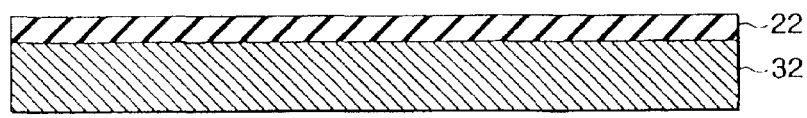
FIGS. 5A and 5B show another embodiment for carrying out the step shown in FIG. 3A.
Figure 5B:
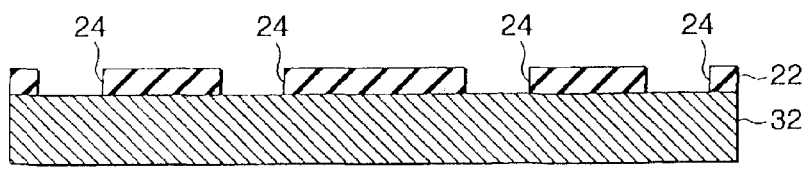

In FIGS. 5A and 5B is shown a manner of forming the outer insulator layer 22 having through-holes 24 without using a photosensitive resin. A resin is applied to the metal plate 32 by coating or transferring a dry film of the resin to form an outer insulator layer 22 as shown in FIG. 5A. Then outer via-holes 24 are made by known techniques, such as laser machining or plasma machining as shown in FIG. 5B.

Use of a photosensitive resin in the formation of the outer insulator layer 22 is advantageous over the manner comprising once forming the outer insulator layer 22 followed by making via-holes 24 by machining; for the former achieves formation of a great number of via-holes 24 at a fine pitch all at once.

Figure 3B:
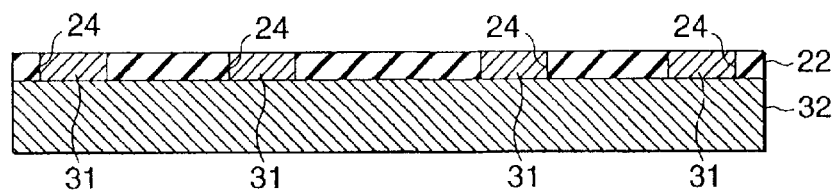

In step (2), illustrated in FIG. 3B, metal is made to deposit by electroplating in the outer via-holes 24 to substantially the same level as the upper surface of the outer insulator layer 22 to form outer electrodes 31. Electroplating is effected by using the metal plate 32 as a negative electrode. Metals which can be deposited by electroplating preferably include gold, copper, nickel, and solder. Copper is particularly preferred. Since electroplating can be achieved by applying a voltage to the metal plate 32, the outer electrodes 31 can be formed easily and reliably without forming plating leads.

Figure 3C:
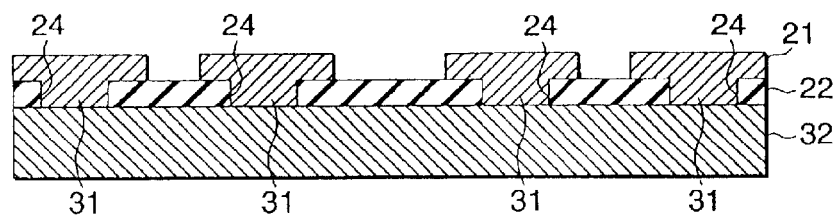
Figure 3D:
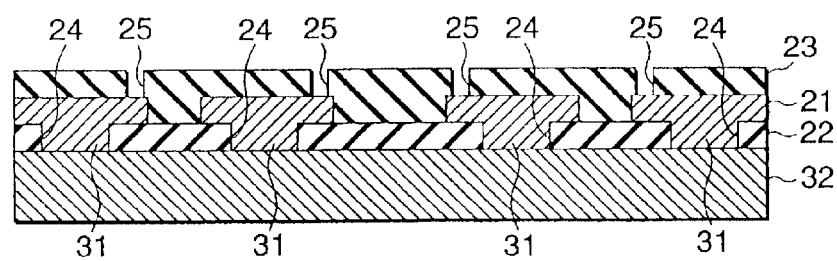

In step (3), shown in FIG. 3C, a conductor layer 21 is formed on the outer electrodes 31 in a prescribed circuit pattern. The conductor layer 21 can be of any electrically conductive material known as conductors of printed wiring boards, including metals such as gold, silver, copper, platinum, lead, tin, nickel, cobalt, indium, rhodium, chromium, tungsten, and ruthenium; and alloys of these metals. While not limiting, the thickness of the conductor layer 21 is suitably about 5 to 15 $\mu$m.

Formation of the conductor layer 21 as a circuit pattern on the outer insulator layer 22 can be carried out by any known technique, such as a subtractive method, an additive method, and a semi-additive method. Patternwise formation of the conductor layer 21 by a subtractive method is carried out by forming a conductor layer 21 on the entire surface of the outer insulator layer 22 inclusive of the top of the outer electrodes 31, forming an etching resist on the conductor layer 21 in agreement with the prescribed circuit pattern, etching the conductor layer 21, and removing the etching resist. Patternwise formation of the conductor layer 21 by an additive method is carried out by forming a plating resist on the outer insulator layer 22 in areas corresponding to the gaps or intervals between patterning wires, forming a conductor layer 21 by plating on the parts of the outer insulator layer 22 uncovered with the plating resist, and removing the plating resist. Patternwise formation of the conductor layer 21 by a semi-additive method is performed by forming a thin conductor film as an undercoat on the outer insulator layer 22, forming a plating resist on the undercoat in a pattern corresponding to the gaps between patterning wires, forming a conductor layer 21 on the parts of the undercoat uncovered with the plating resist, and removing the plating resist and the undercoat under the plating resist. Of these methods, the semi-additive method is preferred.

In a highly preferred embodiment, the outer electrodes 31 and the conductor layer 21 are formed by continued electroplating using the metal plate 32 as a negative electrode in accordance with the semi-additive method as shown in FIG. 6.

Figure 6A:
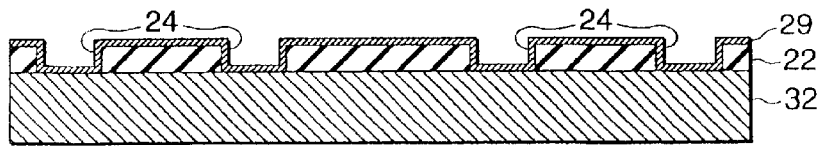
FIGS. 6A to 6E show an embodiment for continuously carrying out the step shown in FIG. 3b (formation of outer electrodes) and the step shown in FIG. 3C (formation of a conductor layer) in a semi-additive mode.

In FIG. 6A, a thin conductor film, i.e., an undercoat 29 is formed on the entire surface of the outer insulator layer 22 and on the upright wall and the bottom of the outer via-holes 24. The undercoat 29 can be formed by known thin film forming techniques, such as electroless plating and vacuum deposition techniques, including sputtering, resistance heating evaporation, and electron beam evaporation. Sputtering is preferred. The undercoat 29 can be of any material that has electrical conductivity and is capable of improving the adhesion between the outer insulator layer 22 and the conductor layer 21. Chromium or copper is preferred where the conductor layer 21 is copper. The undercoat 29 may have a multilayer structure. For example, it can have a double layer structure composed of a 300 to 700 Å thick chromium layer and a 1000 to 3000 Å thick copper layer.

Figure 6B:
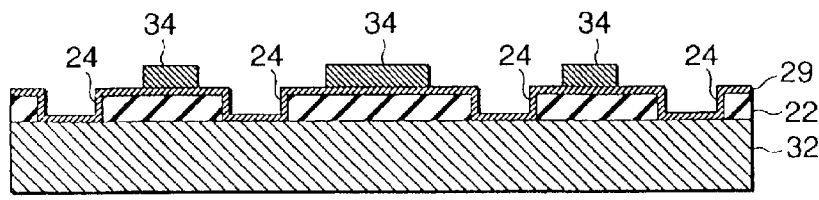
Figure 6C:
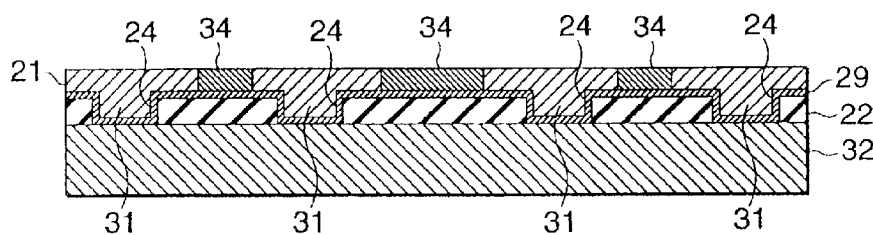

In FIG. 6B, a plating resist 34 is formed on the undercoat 29 in areas corresponding to the gaps between patterning wires. The plating resist 34 can be provided in a conventional manner by using, for example, a dry film resist. In FIG. 6C, outer electrodes 31 and a conductor layer 21 are formed continuously by electroplating using the metal plate 32 as a negative electrode. In this electroplating, metal is first electrodeposited in the outer via-holes 24 to form outer electrodes 31. The electroplating is continued to deposit the metal on the area of the outer insulator layer 22 uncovered with the plating resist 34 to form a conductor layer 21 in a prescribed circuit pattern. Since the outer electrodes 31 and the conductor layer 21 can be provided by a single operation, this preferred embodiment is advantageous for process simplification, making it feasible to manufacture the interposer 20 efficiently.

Figure 6D:
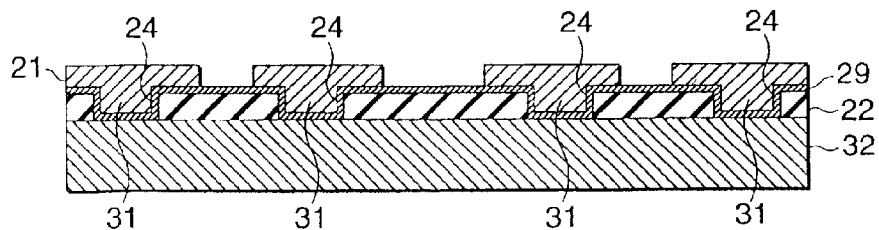
Figure 6E:
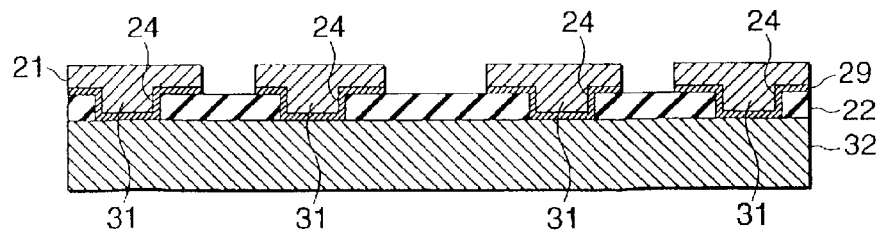

The plating resist 34 is removed by known etching techniques, for example, chemical etching, or stripping as shown in FIG. 6D. The part of the undercoat 29 on which the plating resist 34 has been formed is also removed by known etching techniques, such as chemical etching, as shown in FIG. 6E. There is thus provided the structure shown in FIG. 3C having outer electrodes 31 in the outer via-holes 24 and a conductor layer 21 (circuit pattern) on the outer insulator layer 22, wherein the undercoat 29 used in the semi-additive method is not shown.

An inner insulator layer 23 having inner via-holes 25 is then formed on the conductor layer 21 (circuit pattern). The inner insulator layer 23 can be formed of the same resin in the same manner as for the outer insulator layer 22. The thickness of the inner insulator layer 23 is not particularly limited but suitably ranges from about 5 to 30 $\mu$m, particularly about 7 to 20 $\mu$m.

It is preferred for the inner insulator layer 23 to have adhesiveness (heat fusibility) so that it may be adhered by heat fusion to a semiconductor chip 18 by itself. In this viewpoint, a photosensitive resin having adhesiveness, especially photosensitive polyimide having adhesiveness is used for preference.

Where the inner insulator layer 23 is formed of photosensitive polyimide, it is preferably formed in a negative patterning mode similarly to the formation of the outer insulator layer 22, which is illustrated in FIG. 7. That is, a photosensitive polyamic acid resin layer 23p is formed on the conductor layer 21 as shown in FIG. 7A. The photosensitive polyamic acid resin layer 23p is irradiated through a photomask 33 which is properly positioned to be mated with the electrodes of the semiconductor chip 18 (see FIG. 1) as shown in FIG. 7B. After exposure through the photomask 33, the polyamic acid resin layer 23p is heated at a prescribed temperature to make the exposed area insoluble and then developed with an appropriate developer to dissolve and remove the unexposed area thereby to form inner via-holes 25 as shown in FIG. 7C.

The photosensitive polyamic acid resin for forming the inner insulator layer 23 is preferably prepared from 3,3',4, 4'-oxydiphthalic acid dianhydride (OPDA), 2,2-bis(3,4-dicarboxyphenyl)hexafluoropropane dianhydride (6FDA), etc. as an acid dianhydride component and 1,3-bis(3-aminophenoxy)benzene (APB), bisaminopropyltetramethyldisiloxane (APDS), m-phenylenediamine (MPD), etc. as a diamine component. The photosensitizer can be selected from those useful in the photosensitive polyamic acid resins for the outer insulator layer. As previously mentioned, it is preferred for the inner insulator layer 23 to have adhesiveness after imidation. From this viewpoint, it is preferred for the photosensitive polyamic acid resin for the inner insulator layer 23 to have a melt viscosity (250° C.) of 1000 to 1,000,000 Pa.S, particularly 5,000 to 500,000 Pa.S, and a glass transition temperature (Tg) of 50 to 250° C., particularly 100 to 200° C., after curing (imidation).

Figure 7A:
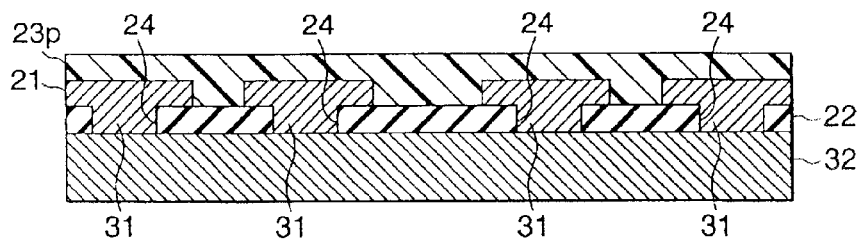
FIGS. 7A to 7D show an embodiment for carrying out the step shown in FIG. 3D (formation of an inner insulator layer having inner via-holes on the conductor layer).
Figure 7B:
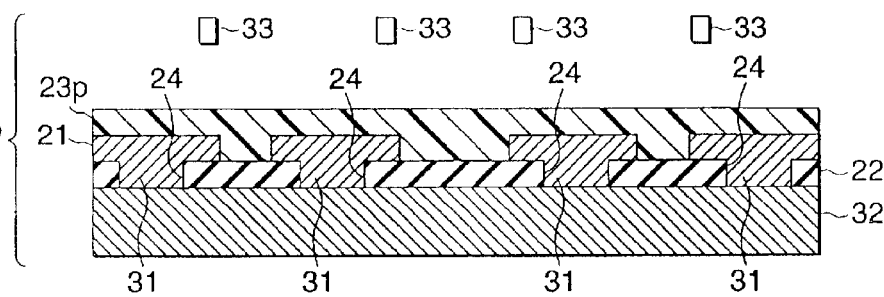
Figure 7C:
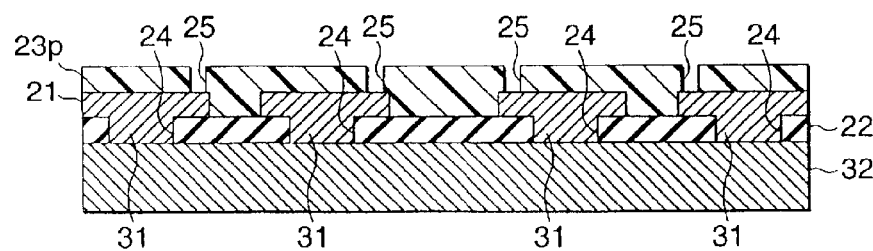
Figure 7D:
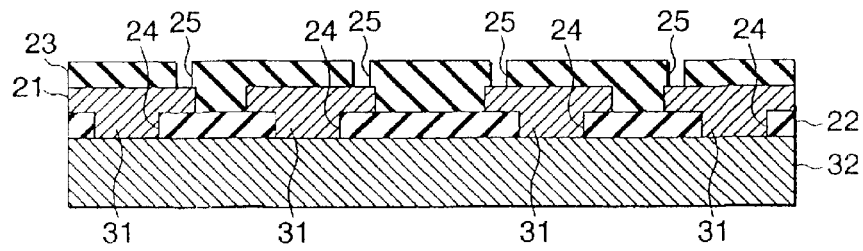

The polyamic acid resin layer 23p having the inner via-holes 25 is then cured by, for example, heating to a final temperature of 250° C. or higher to form an inner insulator layer 23 made of polyimide as shown in FIG. 7D.

Figure 8A:
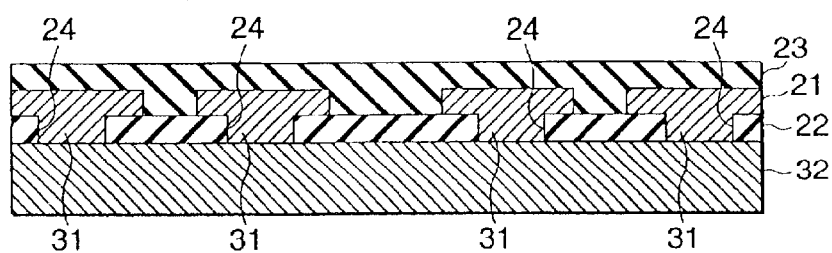
FIGS. 8A and 8B show another embodiment of the step shown in FIG. 3D.
Figure 8B:
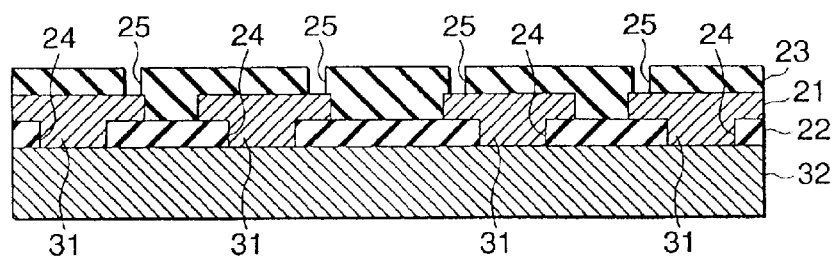

In FIG. 8 is shown a manner of forming the inner insulator layer 23 having through-holes 25 without using a photosensitive resin. As shown in FIG. 8A, a resin is applied to the conductor layer 21 by coating or transferring a dry film of the resin to form an inner insulator layer 23 similarly to the formation of the outer insulator layer 22. Inner via-holes 25 are then made by known techniques, such as laser machining or plasma machining as shown in FIG. 8B.

Use of a photosensitive resin in the formation of the inner insulator layer 23 is advantageous over the manner comprising once forming the inner insulator layer 23 followed by making via-holes 25 by machining; for the former achieves formation of a large number of via-holes 25 at a fine pitch all at once.

Figure 3E:
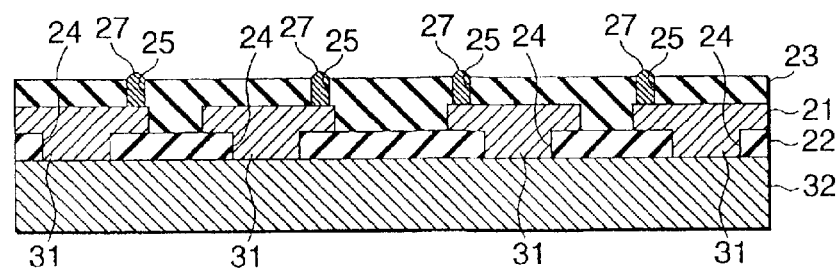

As shown in FIG. 3E, inner electrodes 27 are formed in the inner via-holes 25 by electroplating by applying a voltage to the metal plate 32 as a negative electrode which electrically connects with the outer electrodes 31 and the conductor layer 21. Metal is built up from the bottom of the inner via-holes 25, i.e., the exposed upper surface of the conductor layer 21. The metal to be deposited can be of the same as those useful for forming the outer electrodes 31. Copper is used for preference. Since the electroplating can be accomplished by voltage application to the metal plate 32, the inner electrodes 27 can be formed easily and reliably without the need of forming plating leads on the conductor layer 21.

Figure 3F:
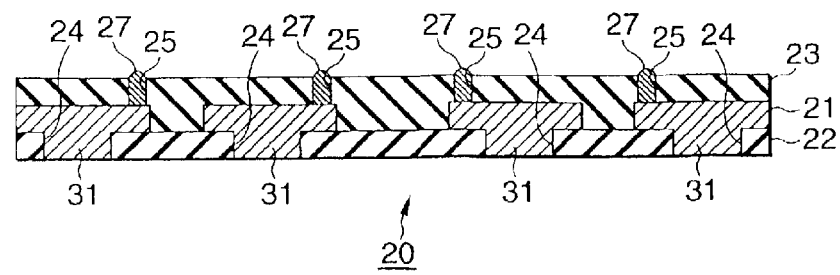

Finally, in step (4), shown in FIG. 3F, the metal plate 32 is removed to obtain an interposer 20. The metal plate 32 can be removed by known etching techniques, such as chemical etching. In case where the outer electrodes 31 and the conductor layer 21 have been formed in a semi-additive manner, the undercoat 29 is exposed on removal of the metal plate 32. In this case, the exposed undercoat 29 is also removed by known etching techniques, such as chemical etching.

In using the interposer 20 for surface mounting of semiconductor chips, solder balls 26 are affixed to the outer electrodes 31 as shown in FIG. 1.

In the resulting interposer 20 all the outer electrodes 31, the conductor layer 21, and the inner electrodes 27 are layers formed by electroplating using the metal plate 32 that has existed on the outer insulator layer 22 and removed therefrom after all the electroplating operations complete. Therefore, no leads for electroplating has been formed on the conductor layer 21, and the arrangement of the electrodes is not restricted by the arrangement and interval of plating leads. For example, the outer electrodes 31 can be arrayed regularly at a fine pitch and a high density as schematically shown in FIG. 2.

The interposer 20 sufficiently copes with the recent demand for size reduction and is effectively used in surface mounting of chip scale packages. Having no plating leads on the conductor layer 21, the interpose 20 does not cause crosstalks attributed to plating leads and thus presents improved reliability.

In the above-described embodiments, the inner electrodes 27 have a bumpy top surface which will be flattened when joined to a semiconductor chip 18, while the outer electrodes 31 have a flat top surface, to which solder bumps are to be affixed. These shapes of electrodes can be altered appropriately according to the purpose and use of the printed wiring board. Further, the order of the steps included in the process can be changed appropriately according to the purpose and use.

In the above-described embodiments, both the outer electrodes 31 and the inner electrodes 27 are formed by electroplating, which is also subject to alteration according to the purpose and use. For example, the inner electrodes 27 may be formed by electroless plating. Conversely, the outer electrodes 31 may be formed by electroless plating, in which case an inner insulator layer 23 having inner via-holes 25 is first formed on a metal plate 32, and inner electrodes 27 are formed by electroplating using the metal plate 32 as a negative electrode.

Figure 9A:
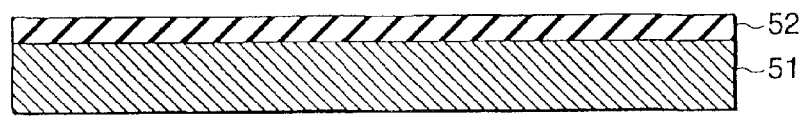
FIGS. 9A to 9E show the steps involved in the production of another embodiment of the printed wiring board according to the invention.
Figure 9B:
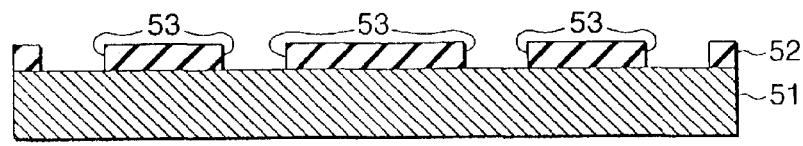
Figure 9C:
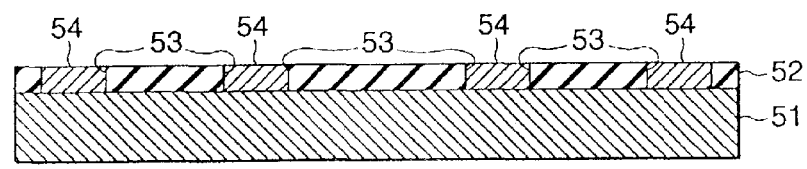
Figure 9D:
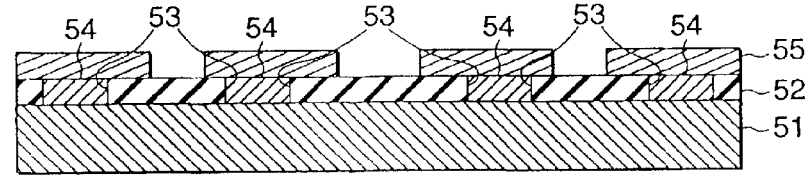
Figure 9E:
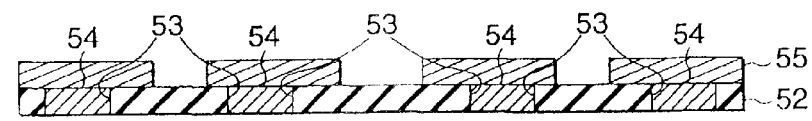

While the invention has been described with particular reference to the production of the interposer 20 for chip size packages, the printed wiring board according to the invention is not limited to the above-described embodiments and includes, for example, a printed wiring board having a double layer structure as shown in FIG. 9E—an insulator layer 52 and a conductor layer 55. The wiring board shown in FIG. 9E can be produced in the same manner as described above. In some detail, a metal plate 51 made of a metal capable of serving as a negative electrode in electroplating is laminated with an insulator layer 52 (FIG. 9A). Via-holes 53 are made in the insulator layer 52 in the same manner as described above (FIG. 9B). Electrodes 54 are formed in the via-holes 53 by electroplating using the metal plate 51 as a negative electrode (FIG. 9C). Subsequently, a conductor layer 55 is provided in the same manner as described above (FIG. 9D), and finally the metal plate 51 is removed (FIG. 9E).

The present invention will now be illustrated in greater detail with reference to Examples and Comparative Examples, but it should be understood that the invention is not limited thereto. It should be noted that the drawings referred to here are intended to be representative and are not to scale.

EXAMPLE 1

A photosensitive polyamic acid resin having the following composition was applied to a 25 μm thick SUS plate (metal plate 32) and dried at 100° C. for 20 minutes to form an outer polyamic acid resin layer 22p (FIG. 4A).

Outer Polyamic Acid Resin Composition

Acid dianhydride component: 3,3', 4,4'-oxydiphthalic acid dianhydride (0.5 mol) and 2,2-bis(3,4-dicarboxyphenyl)hexafluoropropane dianhydride (0.5 mol)

Diamine component: 4,4'-diaminodiphenyl ether (0.5 mol) and p-phenylenediamine (0.5 mol)

Photosensitizer: 1-ethyl-3,5-dimethoxycarbonyl-4-(2-nitrophenyl)-1,4-dihydropyridine (0.26 mol)

Organic solvent: N-methyl-2-pyrrolidone

The outer polyamic acid resin layer 22p was irradiated with g-rays through a photomask 28 (FIG. 4B), heated at 170° C. for 3 minutes, and developed with an alkali developer to make an orderly array of a prescribed number of outer via-holes 24 having a diameter of 400 μm at a fine pitch (FIG. 4C). The polyamic acid resin layer 22p was cured (imidated) by heating at 400° C. for 30 minutes to form a 10 μm thick outer insulator layer 22 comprising polyimide (FIG. 4D).

Chromium and copper were deposited in this order on the entire upper surface of the outer insulator layer 22 and the upright wall and the bottom of the outer via-holes 24 by sputtering to deposit thicknesses of about 300 Å and about 1000 Å, respectively, to form an undercoat 29 (FIG. 6A).

A 15 μm thick dry film resist (plating resist 34) having a resist pattern was applied thereon (FIG. 6B). Copper was deposited in the outer via-holes 24 by electroplating using the metal plate 32 as a negative electrode to build up outer electrodes 31. Electrodeposition was continued to deposit copper on the outer insulator layer 22 to the same level as the upper surface of the plating resist 34 to form a conductor layer 21 having the same thickness as the plating resist (15 μm) in a prescribed circuit pattern (FIG. 6C).

The plating resist 34 was removed with an alkali etching solution (FIG. 6D). The undercoat 29, i.e., a laminate of a copper film and a chromium film, having been covered with the plating resist 34 was removed with acid etching solution and an alkali etching solution, respectively (FIG. 6E).

A photosensitive polyamic acid resin having the following composition was applied on the conductor layer 21 and dried at 100° C. for 20 minutes to form an inner polyamic acid resin layer 23p (FIG. 7A).

Inner Polyamic Acid Resin Composition

Acid dianhydride component: 3,3',4,4'-oxydiphthalic dianhydride (1.0 mol)

Diamine component: 1,3-bis(3-aminophenoxy)benzene (0.8 mol) and bisaminopropyltetramethyldisiloxane (0.2 mol)

Photosensitizer: 1-ethyl-3,5-dimethoxycarbonyl-4-(2-nitrophenyl)-1,4-dihydropyridine (0.26 mol)

Organic solvent: N-methyl-2-pyrrolidone

The inner polyamic acid resin layer 23p was exposed to g-rays through a photomask 33 (FIG. 7B), heated at 170° C. for 3 minutes, and developed with an alkali developer to form inner via-holes 25 having a diameter of 50 μm (FIG. 7C). The inner polyamic acid resin layer 23p was cured (imidated) by heating at 300° C. for 30 minutes to form a 10 μm thick inner insulator layer 23 comprising polyimide (FIG. 7D)

The inner via-holes 25 were electroplated successively with copper and gold to form inner electrodes 27 by imposing a voltage to the metal plate 32 as a negative electrode (FIG. 3E). The inner electrodes 27 were covered with a strippable protective film (of weak adhesion type; resistant to acid and alkali) by means of a roll laminator. The metal plate 32 was removed completely with an etching solution containing ferric chloride (FIG. 3F). The undercoat 29 exposed on the outer insulator layer 22, i.e., the laminate of a copper film and a chromium film, was removed with an acid etching solution and an alkali etching solution, respectively. A thin gold film was formed to a thickness of 0.5 μm by electroless plating to obtain an interposer 20 for a chip size package.

The resulting interposer 20 had all the requisite number of outer electrodes 31 in an orderly array within the space corresponding to the size of a semiconductor chip 18 to be mounted as shown in FIG. 2.

COMPARATIVE EXAMPLE 1

Figure 10A:
FIGS. 10A to 10E, 11F to 11I, and 12J to 12L illustrate the steps involved in the production of the interposer of Comparative Example 1.
Figure 10B:
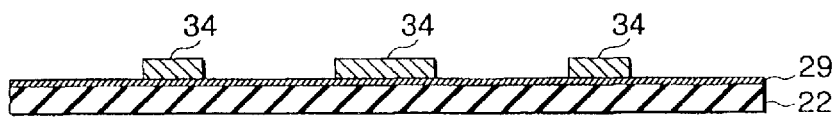
Figure 10C:
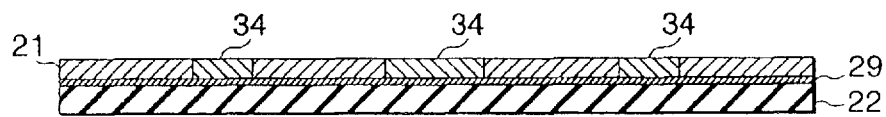
Figure 12J:
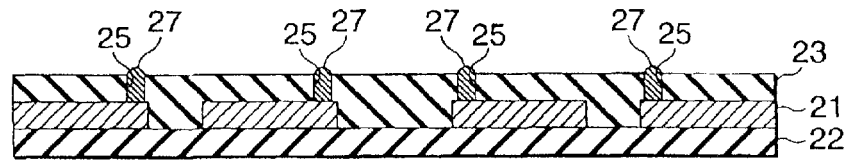
Figure 12K:
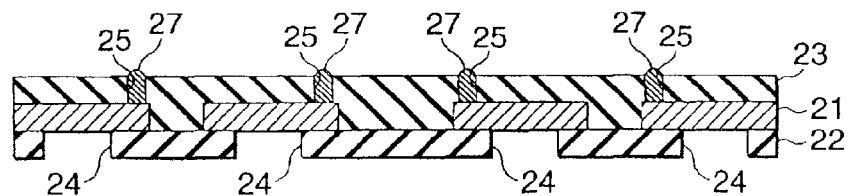
Figure 12L:
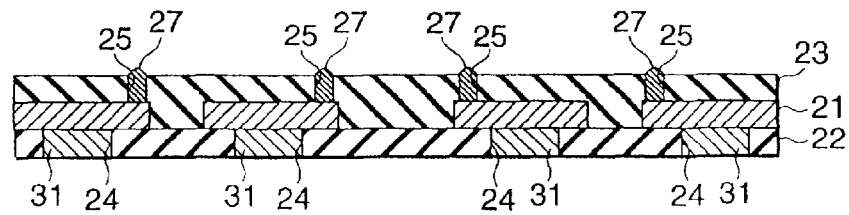
Figure 13:
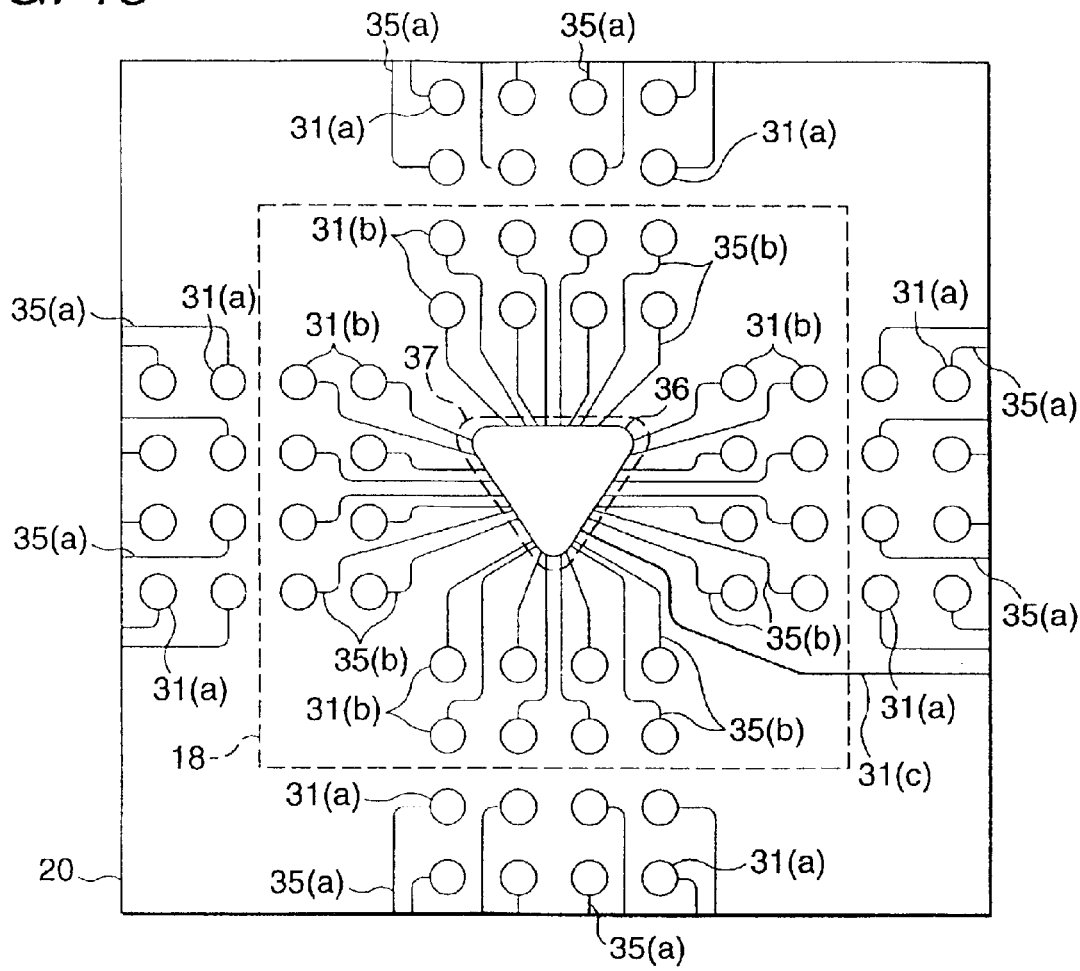
FIG. 13 is a schematic plan view of the outer side of the interposer produced through the steps of FIGS. 10A to 10E, 11F to 11I, and 12J to 12L.
Figure 14:
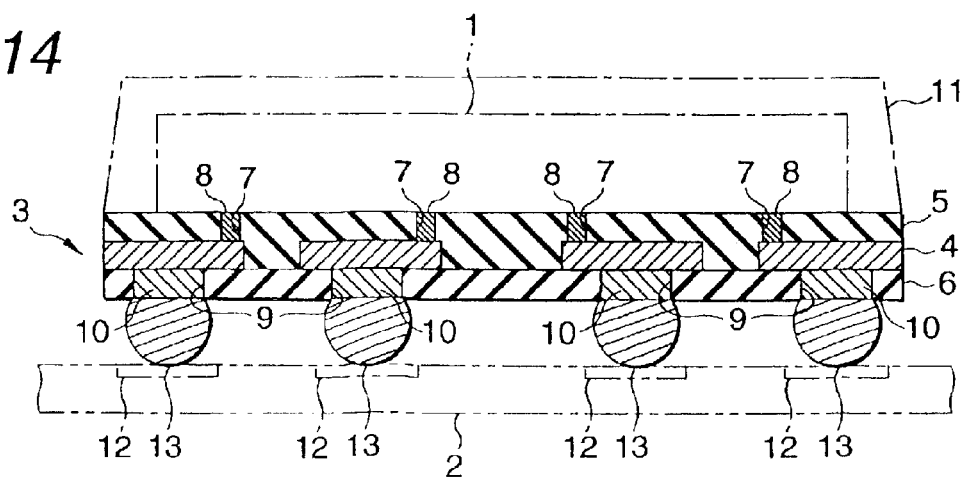
FIG. 14 is a cross-sectional view of an interposer for a chip size package of the related art.

FIGS. 11 through 13 are referred to. A 10 μm thick polyimide film was prepared as an outer insulator layer 22. Chromium and copper were deposited in this order by sputtering on the outer insulator layer 22 to deposit thicknesses of about 300 Å and about 1000 Å, respectively, to form an undercoat 29 (FIG. 10A). A 15 μm thick dry film resist as a plating resist 34 was applied to form a resist pattern (FIG. 10B). Copper was deposited on the outer insulator layer 22 by electroplating to form a conductor layer 21 in a prescribed circuit pattern and also plating leads for electrode formation (FIG. 10C). The thickness of the conductor layer 21 was the same as that of the plating resist 34 (i.e., 15 μm).

Figure 10D:
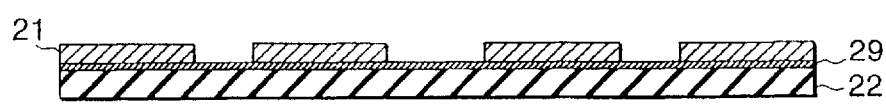
Figure 10E:
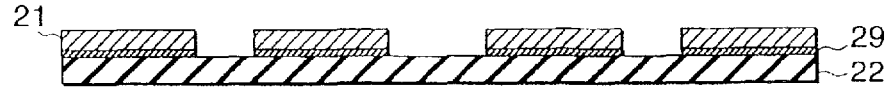

The plating resist 34 was removed with an alkali etching solution (FIG. 10D), and the undercoat 29, i.e., a laminate of a copper film and a chromium film, on which the plating resist 34 had been formed was removed with an acid etching solution and an alkali etching solution, respectively (FIG. 10E).

Figure 11F:
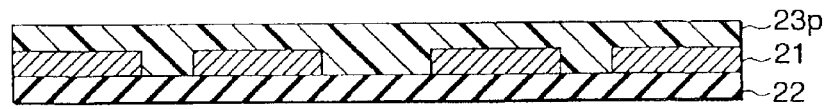
Figure 11G:
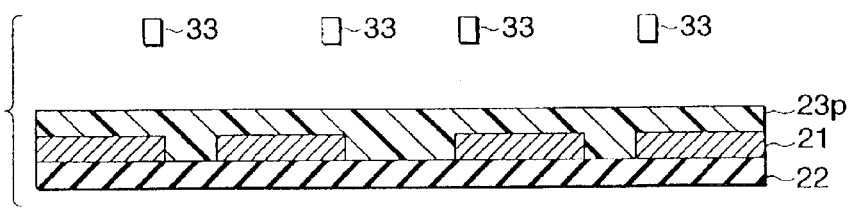

A photosensitive polyamic acid resin having the following composition was applied on the conductor layer 21 and dried at 100° C. for 20 minutes to form an inner polyamic acid resin layer 23p (FIG. 11F).

Inner Polyamic Acid Resin Composition

Acid dianhydride component: 3,3',4,4'-oxydiphthalic dianhydride (1.0 mol)

Diamine component: 1,3-bis(3-aminophenoxy)benzene (0.8 mol) and bisaminopropyltetramethyldisiloxane (0.2 mol)

Photosensitizer: 1-ethyl-3,5-dimethoxycarbonyl-4-(2-nitrophenyl)-1,4-dihydropyridine (0.26 mol)

Organic solvent: N-methyl-2-pyrrolidone

Figure 11H:
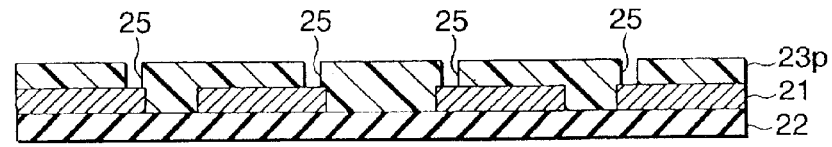
Figure 11I:
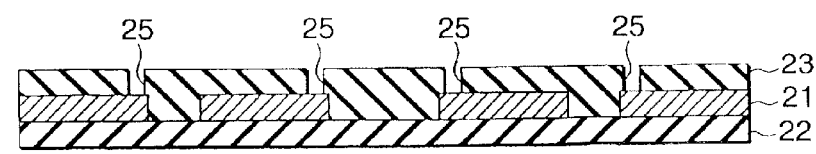

The inner polyamic acid resin layer 23p was exposed to g-rays through a photomask 33 (FIG. 11G), heated at 170° C. for 3 minutes, and developed with an alkali developer to make inner via-holes 25 having a diameter of 50 μm (FIG. 11H). The inner polyamic acid resin layer 23p was cured (imidated) by heating at 300° C. for 30 minutes to form a 10 μm thick inner insulator layer 23 comprising polyimide (FIG. 11I)

The inner via-holes 25 were plated successively with copper and gold to form inner electrodes 27 by electroplating using the conductor layer 21 as a negative electrode (FIG. 12J). Then, the outer insulating layer 22 was processed by laser machining to make a prescribed number (the same number as in Example 1) of outer via-holes 24 having a diameter of 400 μm (FIG. 12K). The outer via-holes 24 were plated with copper by electroplating using the conductor layer 21 as a negative electrode, and subsequently gold was deposited thereon to a thickness of 0.5 μm to form outer electrodes 31 (FIG. 12L).

The outer side of the resulting interposer 20 is shown in FIG. 13. Because the arrangement and interval of the electrodes are restricted by the plating leads 35 leading to every electrode, all the required number of the outer electrodes 31 could not be formed within the space corresponding to the size of a semiconductor chip 18 to be mounted.

In more detail, the outer electrodes 31(*a*) arranged in the peripheral portion of the interposer 20 were connected to a power source via plating leads 35(*a*) extending from the edges of the interposer 20. Because of the small intervals among the outer electrodes 31(*a*), the leads from the edges could not be drawn to the outer electrodes 31(*b*) arranged in the central portion of the interposer 20. Then, a relay contact point 36 was formed in the center of the interposer 20, from which plating leads 35(*b*) were extended to the electrodes 31(*b*). The central relay contact point 36 was connected to the power source via four plating leads 35(*c*) extending from the edges of the interposer 20 (FIG. 13 shows only one lead 35(*c*) out of four) so that all the outer electrodes 31 might be electrically connected to each other during electroplating. On completion of the electroplating, the relay contact point 36 was cut out along the broken line 37 to disconnect the outer electrodes 31. As a result, it was impossible to form the outer electrodes 31 in an orderly array as could be achieved in Example 1 as shown in FIG. 2.

While the invention has been described in detail and with reference to specific examples thereof, it will be apparent to one skilled in the art that various changes and modifications can be made therein without departing from the spirit and scope thereof.

The entire disclosure of each and every foreign patent application from which the benefit of foreign priority has been claimed in the present application is incorporated herein by reference, as if fully set forth.

What is claimed is:

1. A process for manufacturing a printed wiring board, comprising at least the steps of:
   forming a first insulator layer having at least one through-hole at a predetermined position on a metal plate capable of serving as a negative electrode of electroplating;
   forming a first electrode in the at least one through-hole by electroplating using the metal plate as a negative electrode;
   forming a conductor layer on the first insulator layer, the conductor layer being connected to the first electrode; and
   removing the metal plate.

2. The process according to claim 1, wherein the step of forming a conductor layer is carried out by continuously electroplating subsequent to the step of forming the electrode.

3. The process according to claim 2, wherein the process further comprises:
   forming a second insulator layer having at least one through-hole at a predetermined position on the conductor layer; and
   forming a second electrode in the at least one through-hole of the resulting second insulator layer by electroplating using the metal plate as a negative electrode.

4. The process according to claim 1, wherein the process further comprises:
   forming a second insulator layer having at least one through-hole at a predetermined position on the conductor layer; and
   forming a second electrode in the at least one through-hole of the resulting second insulator layer by electroplating using the metal plate as a negative electrode.

* * * * *